United States Patent [19]

Hordon et al.

[11] 4,440,803
[45] Apr. 3, 1984

[54] PROCESS FOR PREPARING ARSENIC-SELENIUM PHOTORECEPTORS

[75] Inventors: Monroe J. Hordon, Pittsford; Robert E. Gerace, Fairport, both of N.Y.

[73] Assignee: Xerox Corporation, Stamford, Conn.

[21] Appl. No.: 255,201

[22] Filed: Apr. 20, 1981

Related U.S. Application Data

[63] Continuation of Ser. No. 90,835, Nov. 1, 1979, abandoned.

[51] Int. Cl.³ .............................................. B05D 5/12
[52] U.S. Cl. ........................................ 427/74; 427/76; 427/255.5
[58] Field of Search ..................... 427/255.5, 251, 74, 427/76, 124; 118/667, 688, 694

[56] References Cited

U.S. PATENT DOCUMENTS

| | | | |
|---|---|---|---|
| 2,803,542 | 8/1957 | Ullrich | 75/134 H |
| 2,822,300 | 2/1958 | Mayer et al. | 427/73 |
| 3,312,548 | 4/1967 | Straughan | 75/134 H |
| 3,417,733 | 12/1968 | Makino | 427/251 |
| 3,499,790 | 3/1970 | Engelmann | 427/255.5 |
| 3,622,712 | 11/1971 | Moore et al. | 427/89 |
| 3,667,421 | 6/1972 | Bala et al. | 118/694 |
| 3,667,424 | 6/1972 | Cornelius et al. | 118/727 |
| 3,793,070 | 2/1974 | Schoolar | 118/666 |
| 3,911,162 | 10/1975 | Erhart et al. | 427/39 |
| 4,126,457 | 11/1978 | Ciuffini | 427/76 |

OTHER PUBLICATIONS

IBM Technical Disclosure Bulletin, vol. 19, No. 11, Apr. 1977, Schillinger, "Hybrid Sensor Control System".

IBM Technical Disclosure Bulletin, vol. 4, No. 7, Dec. 1961, Ames et al., "Alloy Evaporation Rate Controller".

IBM Tech. Disclosure Bulletin, vol. 14, No. 9, Feb. 1972, Wald et al., "Evaporation Apparatus".

*Primary Examiner*—Sadie L. Childs

[57] ABSTRACT

A process for preparing arsenic-selenium photoreceptors wherein the arsenic distribution in the photoreceptor, particularly at its top surface, is controlled within a preferred concentration range, which comprises controlling the evaporation rate of the arsenic-selenium alloy by means of a crucible weight sensing system to monitor alloy depletion rate and a cascade dual-loop feedback control system processing both crucible assembly weight change and temperature to modify resistive power input.

9 Claims, No Drawings

PROCESS FOR PREPARING ARSENIC-SELENIUM PHOTORECEPTORS

This is a continuation of application Ser. No. 090,835, filed Nov. 1, 1979, now abandoned.

BACKGROUND OF THE INVENTION

This invention relates, in general, to the preparation of arsenic-selenium photoreceptors and, in particular, to fabrication of said photoreceptors wherein the arsenic distribution, particularly at its top surface, is controlled within a preferred concentration range.

The concept of xerography was originally described by Carlson in U.S. Pat. No. 2,297,691 and is further amplified and described by many related patents in the field. The discovery of the photoconductive insulating properties of highly purified vitreous selenium has resulted in this material becoming a standard in reuseable commercial xerography. The outstanding advantages of vitreous selenium is its capability of holding and retaining an electrostatic charge for long periods of time when not exposed to light, and its relative sensitivity to light as compared to many other photoconductive materials. In addition, vitreous selenium exhibits excellent physical strength and stability to be reused or cycled thousands of times.

Vitreous selenium, however, does suffer from one serious disadvantage in that it becomes unstable at temperatures slightly above about 100° F. and begins to crystallize and become conductive in the dark rendering it unsuitable for use in xerography. U.S. Pat. Nos. 2,803,542 and 2,822,300 to Ullrich and Mayer et al, respectively, teach that the incorporation of elemental arsenic with selenium not only increases the spectral response of the selenium but in addition greatly increases the resistance of selenium to crystallization at elevated temperatures. In addition to alloying with arsenic, the addition of a halogen such as iodine or chlorine when added to arsenic-selenium alloys has been found to improve electrical characteristics such as sensitivity and spectral response. This contribution to the art is set forth in U.S. Pat. No. 3,312,548 to Staughan.

The arsenic-selenium alloys described in the above patents, are normally prepared by mixing a master alloy having the appropriate proportion of arsenic and selenium and placing the material in a closed container capable of being evacuated. The evaporation is carried out under vacuum conditions by heating a crucible containing the alloy mixture and allowing vapors of the arsenic-selenium alloy to condense and form a vitreous layer on a substrate normally supported above a crucible containing the alloy.

U.S. Pat. No. 3,911,162 to Erhart et al discloses a method of vapor depositing a uniform film of photoconductive material on a substrate which comprises positioning a plurality of substrate bodies on a plurality of elongated horizontal extending cylindrical mandrels, rotating each of said mandrels about an associated longitudinal axis thereof while simultaneously transporting the mandrels in an annular path about a horizontal axis. Vapor deposition is carried out under vacuum using a photoconductive material, such as an arsenic-selenium alloy, which is positioned in a planar array of crucibles which is located within the annular path of travel of the mandrels. The disclosure contained in U.S. Pat. No. 3,911,162 is incorporated herein by reference.

Employing the evaporation methods and equipment disclosed in U.S. Pat. No. 3,911,162 with selenium alloys containing up to about 0.5% by weight of arsenic fractionate, there is produced a progressive enrichment of arsenic content in the melt remainder. For the usual conditions in which a fixed charge of alloy is completely exhausted from the crucible, the photoreceptor also progressively enriches in arsenic level with the major portion of the arsenic content being concentrated in the final layers of the deposit, corresponding to the arsenic composition of the terminal melt volume. Generally, top surface arsenic contents of less than about 1% by weight or greater than about 5% by weight are considered undesirable. For many photoreceptors, including the Xerox 9200 and 3100 type photoreceptors, the preferred mean top surface arsenic content is about 2.5% by weight. Low top surface arsenic values may lead to photoreceptor failure through surface crystallization while high top surface arsenic levels can impair electrical properties such as residual voltage. For many photoreceptors including the Xerox 9200 and 3100 photoreceptors, the preferred mean top surface arsenic level is about 2.5% by weight of arsenic.

OBJECTS OF THE INVENTION

It is, therefore, an object of this invention to provide a process for preparing arsenic-selenium photoreceptors devoid of the above-noted disadvantages.

It is another object of this invention to provide a process of preparing arsenic-selenium photoreceptors wherein the top surface arsenic content is above the level which will lead to failure through surface crystallization.

It is still another object of this invention to provide a process of preparing arsenic-selenium photoreceptors wherein the top surface arsenic content is below the level at which electrical properties of the photoreceptor are impaired.

It is yet another object of this invention to provide a process of preparing arsenic-selenium photoreceptors wherein the arsenic level throughout the photoreceptor, including its top surface, is controlled.

SUMMARY OF THE INVENTION

The foregoing objects and others are accomplished in accordance with this invention, generally speaking, by providing a process of preparing arsenic-selenium photoreceptors, wherein the arsenic distribution is controlled within a preferred concentration range, which comprises controlling the evaporation rate of the arsenic-selenium alloy by means of a crucible weight sensing system to monitor alloy depletion rate and a cascade dual-loop feedback control system which processes both crucible weight change and temperature to modify resistive power input.

DETAILED DESCRIPTION OF THE INVENTION

A cascaded crucible thermal heating control system was developed employing dual crucible temperature and arsenic-selenium alloy evaporation rate sensors to process crucible power input. The dual sensor inputs are continuously blended in the control system to produce an integrated feedback response covering the entire arsenic-selenium alloy coating cycle.

In the pre-evaporation and post-evapoaration stages of the coating cycle when evaporation is negligible, crucible power input control is chiefly effected by the crucible temperature feedback loop. During the evaporation stage of the coating cycle, crucible power input is chiefly effected by the evaporation rate feedback loop.

Arsenic fractionation in arsenic-selenium photoreceptor films is controlled by controlling the average rate of alloy evaporation in the coating process. For evaporation rate sensing during the evaporation sequence, monitoring the time depletion of alloy weight in the crucible array was selected as the preferred sensing technique. However, it is apparent to those skilled in the art that alternative evaporation rate sensing methods including quartz crystal deposition, and electron impact emission spectroscopy, are included in the scope of the control system design.

In the preferred embodiment of the control system, evaporation rate is monitored by measuring the time rate of arsenic-selenium alloy weight depletion in the crucible array using a strain gauge load cell assembly. The configuration comprises a sensitive load measurement platform supporting the entire crucible array and underframe. The load platform design adopted comprises four series-connected load cells positioned at the corners of the rectangular crucible array, although other load platform designs could be employed.

In the load cell design, it is desired that the sensitivity to weight change be not less than 0.25% of the total arsenic-selenium alloy weight charged into the crucible array to distinguish a change in evaporation rate of 0.1 micron/minute.

To control the evaporation rate profile, the desired time rate of alloy weight loss is programmed into a Data Trak controller and coupled to the crucible thermal power input. In this mode, the secondary crucible temperature feedback signal is used to modulate the primary crucible weight loss signal so as to limit power excursions and reduce oscillation of the evaporation rate.

Although it can be shown that crucible temperature and evaporation rate are generally related for selenium alloys by an expression of the form:

$$\log E = A - B/T$$

where E is the evaporation rate (grams/cm$^2$-sec) or (microns/min), T is the crucible temperature (°Kelvin), and A and B are suitable constants, practical control of the evaporation rate cannot be maintained solely by crucible temperature control due to changes in crucible resistivity and heat transmission with aging and due to variability in alloy behavior.

With the dual feedback control system, a variety of coating programs can be devised by establishing crucible weight loss profiles and corresponding crucible temperature limits to maintain fixed evaporation rate profiles in repeated coater cycling. To achieve correspondence, complementary weight loss and temperature control patterns are entered into tandem digital data/time programmer units with a common, locked time base. Crucible power input is adjusted against the control programs by cascading the input signal through a series of process controllers.

With the cascade evaporation rate control system installed in a Xerox 9200 photoreceptor vacuum coating unit using 1 GT Alloy comprising selenium and 0.36 weight percent arsenic, rate variation is limited to ±0.1 microns/minute during the major portion of the coating sequence. The mean top surface arsenic level is found to vary with the evaporation rate, decreasing with increase in fixed rate value. Specifically, for the 9200 case, limiting the maximum evaporation rate below about 1.5 microns/minute will insure top surface arsenic values in the preferred range and minimize the occurance of top surface arsenic levels below 1% arsenic. Tests of the procedures outlined above for 9200 photoreceptor have resulted in improved top surface arsenic control with standard deviations of 0.5% arsenic. Additionally, no individual photoreceptors have been measured with top surface arsenic values of less than 1% arsenic or greater than 5% arsenic. Top surface arsenic measurements were obtained by electron microprobe absorption technique with 6 KV radiation corresponding to a top surface mean penetration depth of about 0.3 microns. Further, all coating trials were carried out in a APS 96-inch planetary vacuum coater.

Although reduction in top surface arsenic variability is demonstrated for the 9200 photoreceptor, top surface arsenic may be likewise controlled in any arsenic-selenium photoreceptor in a similar manner. Further, other modifications and ramifications of the present invention would appear to those skilled in the art upon reading this disclosure. These are also intended to be within the scope of this invention.

What is claimed is:

1. A process of vapor depositing a substantially uniform thin film of photoconductive material on a substrate body which comprises:

positioning a plurality of substrate bodies on a plurality of elongated, horizontally extending cylindrical support mandrels;

rotating each of said mandrels about an associated longitudinal axis thereof and simultaneously transporting said plurality of mandrels in an annular path about a horizontal axis;

establishing an evacuated atmosphere about said mandrels;

vaporizing a suitable photoconductive material, which is positioned in a planar array of crucibles located within the annular path of travel of said mandrels, with at least one additional crucible being positioned in an outrigger configuration at each corner of the planar array, said crucible array extending substantially coextensively along the entire length of the plurality of substrate bodies; and controlling the evaporation rate of the photoconductive material by means of a sensing system to monitor both evaporation rate of the photoconductive material and crucible temperature, said sensing system including a cascade dual-loop feedback control system continuously blending the evaporation rate and crucible temperature to produce an integrated feedback response to modify resistive power input to said crucibles to thereby establish an evaporation rate profile for the pre-evaporation, evaporation and post evaporation stages of the coating cycle.

2. The process of claim 1 wherein said evaporation rate of the photoconductive material is sensed by monitoring the photoconductive material time depletion rate.

3. The process of claim 1 wherein the overall process evaporation rate of the photoconductive material is controlled by means of a sensing system to monitor instantaneous evaporation rate and instantaneous crucible temperature.

4. The process of claim 1 wherein said photoconductive material comprises an alloy of selenium and arsenic.

5. The process of claim 4 wherein the evaporation rate of said alloy is controlled so that there is between about 1% and about 5% by weight of arsenic in the top surface of the resulting photoreceptor.

6. The process of claim 4 wherein the evaporation rate of said alloy is controlled so that there is about 2.5% by weight of arsenic in the top surface of the resulting photoreceptor.

7. The process of claim 4 wherein the alloy charge in the crucible array is monitored using a strain load cell assembly wherein the entire crucible array and frame is supported on series-connected strain gauge load cell platform.

8. The process of claim 4 wherein the arsenic fractionation in the thin film of photoconductive material formed is controlled by controlling the average rate of alloy evaporation.

9. A process of vapor depositing a substantially uniform thin film of photoconductive material on a substrate body which comprises:

positioning a plurality of substrate bodies on a plurality of elongated, horizontally extending cylindrical support mandrels;

rotating each of said mandrels about an associated longitudinal axis thereof and simultaneously transporting said plurality of mandrels in an annular path about a horizontal axis;

establishing an evacuated atmosphere about said mandrels;

vaporizing a suitable photoconductive material, which is positioned in a planar array of crucibles located within the annular path of travel of said mandrels, with at least one additional crucible being positioned in an outrigger configuration at each corner of the planar array, said crucible array extending substantially coextensively along the entire length of the plurality of substrate bodies; and controlling the evaporation rate of the photoconductive material by means of a sensing system to monitor both evaporation rate of the photoconductive material and crucible temperature said sensing system including a cascade dual-loop feedback control system continuously blending the evaporation rate and crucible temperature to produce an integrated feedback response to modify resistive power input to said crucibles to thereby establish an evaporation rate profile for the pre-evaporation, evaporation and post evaporation stages of the coating cycle, said pre-evaporation and post evaporation stages of the evaporation rate profile being chiefly controlled by the crucible temperature feedback loop and said evaporation stage of the evaporation rate profile being chiefly controlled by the evaporation rate feedback loop.

* * * * *